US009618546B2

(12) United States Patent
Bamberger et al.

(10) Patent No.: US 9,618,546 B2
(45) Date of Patent: Apr. 11, 2017

(54) METHOD AND DEVICE FOR DETERMINING THE POWER OUTPUT BY A PHOTOVOLTAIC INSTALLATION

(75) Inventors: Joachim Bamberger, München (DE); Ralph Grothmann, München (DE); Kai Heesche, München (DE); Clemens Hoffmann, Kassel (DE); Michael Metzger, Markt Schwaben (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 705 days.

(21) Appl. No.: 14/114,201

(22) PCT Filed: Apr. 25, 2012

(86) PCT No.: PCT/EP2012/057568
§ 371 (c)(1),
(2), (4) Date: Oct. 26, 2013

(87) PCT Pub. No.: WO2012/146618
PCT Pub. Date: Nov. 1, 2012

(65) Prior Publication Data
US 2014/0046610 A1    Feb. 13, 2014

(30) Foreign Application Priority Data

Apr. 28, 2011   (DE) .................. 10 2011 017 694

(51) Int. Cl.
*G01W 1/10*    (2006.01)
*H02S 50/10*    (2014.01)
(Continued)

(52) U.S. Cl.
CPC ............ *G01R 21/133* (2013.01); *H02J 3/383* (2013.01); *H02S 50/10* (2014.12); *Y02E 10/563* (2013.01)

(58) Field of Classification Search
CPC .............. G01W 1/10; H02S 50/10; H02J 3/38
(Continued)

(56) References Cited

U.S. PATENT DOCUMENTS

2010/0198420 A1 * 8/2010 Rettger .................. G01W 1/10
700/291
2010/0309330 A1   12/2010 Beck et al.
(Continued)

FOREIGN PATENT DOCUMENTS

DE      102009024212 B4    3/2012
EP         2262096 A2     12/2010
(Continued)

OTHER PUBLICATIONS

Zimmermann H. G., Neuneier R., Grothmann R.: Modeling of Dynamical Systems by Error Correction Neural Networks, in: Modeling and Forecasting Financial Data, Techniques of Nonlinear Dynamics, Eds. Soofi, A. and Cao, L., Kluwer Academic Publishers, 2002, pp. 237-263.

(Continued)

*Primary Examiner* — Alexander Satanovsky
*Assistant Examiner* — Felix Suarez
(74) *Attorney, Agent, or Firm* — Beusse Wolter Sanks & Maire

(57) ABSTRACT

A method for improving the usability of photovoltaic installations (PV installations) by taking account of shading information of adjacent PV installations for forecasting the power output by a relevant PV installation is provided. In particular, cloud movements and cloud shapes are taken into account. This improves the accuracy of the forecast. Here, it is advantageous that short-term forecasts in relation to e.g. the next 15 minutes are possible and a substitute energy source can be activated accordingly, in good time, prior to a dip in the power output by the PV installation. The invention (Continued)

can be used e.g. in the field of renewable energies, PV installations or smart grids.

16 Claims, 2 Drawing Sheets

(51) Int. Cl.
  *H02J 3/38*     (2006.01)
  *G01R 21/133*   (2006.01)
(58) Field of Classification Search
  USPC .............. 702/3, 60, 179, 183, 184; 307/24; 700/291
  See application file for complete search history.

(56)  References Cited

U.S. PATENT DOCUMENTS

| | | | |
|---|---|---|---|
| 2011/0060475 A1* | 3/2011 | Baldwin | G01W 1/10 700/295 |
| 2011/0066401 A1* | 3/2011 | Yang | G01J 1/4228 702/184 |
| 2011/0084551 A1* | 4/2011 | Johnson | H02J 3/383 307/24 |
| 2011/0220091 A1* | 9/2011 | Kroyzer | F24J 2/38 126/572 |
| 2012/0101645 A1* | 4/2012 | Jun | G05F 1/67 700/287 |

FOREIGN PATENT DOCUMENTS

| | | |
|---|---|---|
| JP | 2007184354 A | 7/2007 |
| JP | 2008182017 A | 8/2008 |
| JP | 2010186840 A | 8/2010 |

OTHER PUBLICATIONS

Beyer H G et al.: "Short Range Forecast of PV Energy Production using Satellite Image Analysis", 12th E.C. Photovoltaic Solar Energy Conference, Amsterdam, NL, Apr. 11-15, 1994, vol. Conf. 12, Apr. 11, 1994; pp. 1718-1721, XP001137100.
Lorenz E et al.: "Irradiance Forecasting for the Power Prediction of Grid-Connected Photovoltaic Systems", IEEE Journal of Selected Topics in Applied Earth Observations and Remote Sensing, IEEE, USA, vol. 2, No. 1, Mar. 1, 2009, pp. 2-10, XP011256562.
Hoff T E et al.: "Quantifying PV power Output Variability", Solar Energy, Pergamon Press. Oxford, GB, vol. 84, No. 10, Oct. 1, 2010, pp. 1782-1793, XP027248955.
Mellit A et al.: "Artificial intelligence techniques for photovoltaic applications: A review", Progress in Energy and Combustion Science, Elsevier Science Publishers, Amsterdam, NL, vol. 34, No. 5, Oct. 1, 2008, pp. 574-632, XP022931260.

* cited by examiner

METHOD AND DEVICE FOR DETERMINING THE POWER OUTPUT BY A PHOTOVOLTAIC INSTALLATION

CROSS REFERENCE TO RELATED APPLICATIONS

This application is the U.S. National Stage of International Application No. PCT/EP2012/057568 filed Apr. 25, 2012, and claims the benefit thereof. The International Application claims the benefit of German Application No. DE 102011017694.2 filed Apr. 28, 2011. All of the applications are incorporated by reference herein in their entirety.

FIELD OF INVENTION

The invention relates to a method and a device for determining a power output by a photovoltaic installation.

BACKGROUND OF INVENTION

The increasing importance of renewable energies in power grids places new demands on forecasting required and available feed-in powers in order thus to be able to control the grid in the best possible manner. This challenge is reflected in the concepts of so-called "smart grids", which also permit decentralized control of the energy flows.

A so-called error correction neural network (ECNN) is disclosed in [Zimmermann H. G., Neuneier R., Grothmann R.: Modeling of Dynamical Systems by Error Correction Neural Networks in Modeling and Forecasting Financial Data, Techniques of Nonlinear Dynamics, Eds. Soofi, A. and Cao, L. Kluwer Academic Publishers, 2002, pp. 237-263].

In order to be able to compensate for a control of load flows in a subordinate grid section of the power grid without in the process having to make use of power from a superordinate grid section, it is necessary to know the expected feed-in powers in advance. Thus, the power balance and/or the operating means load can be compensated for by controllable loads, energy stores or energy producers (e.g. combined heat and power installations (CHP installations)), but this requires a certain amount of lead-in time in order to be able to take into account the dynamics (temporally delayed response behavior) thereof and ultimately to ensure that the controllable loads, energy stores or energy producers are ready for operation in good time.

This is problematic, particularly in the aforementioned renewable energies, because the power provided can vary strongly in the short term.

SUMMARY OF INVENTION

An object of the invention includes avoiding the aforementioned disadvantages and, in particular, of specifying a solution enabling efficient actuation of a grid section, even if it has energy sources based on renewable energies.

This object is achieved in accordance with the features of the independent patent claims. Developments of the invention also emerge from the dependent claims.

In order to achieve this object, a method for determining a power output by a photovoltaic installation is specified on the basis of at least one item of shading information from at least one adjacent photovoltaic installation.

The adjacent photovoltaic installation can also be a (spatially) adjacent measurement zone, which provides data in relation to a shading of solar radiation.

Hence there can be an efficient and short-term forecast of a shading for the photovoltaic installation by virtue of the geographic arrangement in relation to the at least one other photovoltaic installation being taken into account. By determining dynamics of the shading, e.g. a cloud movement, it is possible to predict the orientation of the shading and the speed. Taking into account the distance between the photovoltaic installation and the adjacent photovoltaic installation, it is possible to establish the time until the shading arrives. Accordingly, it is possible—depending on the type and extent of the shading—to activate controllable loads, energy stores or energy producers in good time.

This approach is very accurate because weather situations are generated and taken into account with high temporal resolution and accuracy. Hence it is also possible to forecast the shadings for photovoltaic installations for which the globally available weather information and the temporal forecast duration thereof are too approximate and inaccurate.

A development includes the shading information comprising an item of information based on a reduced brightness and, in particular, based on a shading caused by cloud movement.

Thus, the shading for example is based upon a temporary shading of solar radiation by clouds and other weather effects.

Another development includes several items of shading information being provided by several adjacent photovoltaic installations, a temporal and spatial forecast in relation to an imminent shading being established on the basis of the shading information, the expected power output by the photovoltaic installation being determined on the basis of the imminent shading.

Hence, on the basis of the expected power output by the photovoltaic installation, it is possible to determine in good time that additionally another energy source is required in order to compensate for the imminent shading and the drop in power of the photovoltaic installation connected therewith.

In particular, a development includes another energy source being activated depending on the expected power output by the photovoltaic installation.

A development also includes the other energy source comprising at least one of the following energy sources: a controllable load, an energy store, an energy producer.

A development furthermore includes the several adjacent photovoltaic installations spatially surrounding the photovoltaic installation at least in part.

Thus, the adjacent photovoltaic installations can be arranged around the photovoltaic installation. The photovoltaic installations preferably do not overlap.

Within the scope of an additional development, on the basis of the shading information, a temporal and spatial forecast in relation to an imminent shading is established using a forecasting model.

By way of example, the forecasting model is a nonlinear state space model for identifying and predicting an open dynamic system, which is driven firstly by internal dynamics (installation characteristics) and secondly by external influencing factors (e.g. weather conditions and situation of the adjacent installations). The model can be formulated in the form of a temporally evolving recurrent neural network. The state equation and the output equation of the open dynamics are preferably described as parameterized functions of the neural network. The parameters are matched to the observation data by optimization algorithms in order to obtain the highest possible prediction quality. The neural network optionally contains an error correction mechanism, which reacts to interferences in the dynamics and at least in part compensates for these. The neural network is advantageous, inter alia, in that nonlinear influences can be depicted.

A next development includes a speed of a shading, in particular of a cloud drift, being established by maximizing a cross-correlation $R_{ab}$ $$R_{ab} = \frac{1}{T} \cdot \int_{-T/2}^{T/2} P_a(t) \cdot P_b(t+\tau) dt,$$

with $$\tau = \frac{d_{ab}}{v_{Cloud}},$$

where a, b denote two photovoltaic installations,

T denotes a considered time interval,

P denotes a feed-in power, $d_{ab}$ denotes a distance between the photovoltaic installations a and b, $v_{Cloud}$ denotes an estimated speed of the cloud drift.

One embodiment includes a direction of the shading, in particular of the cloud drift, being established on the basis of a comparison of the cross-correlations of spatially differently aligned photovoltaic installations.

To this end, the cross-correlations are calculated pairwise in each case for the adjacent PV installations and those PV installations with the highest correlation in the change of fed-in amount of energy are determined. From the spatial arrangement of the installations and the time shift of the changes, it is then possible to calculate a movement direction and a movement speed of the cloud drift.

An alternative embodiment includes a direction of a large-area airflow being determined, a variance of the cross-correlation of photovoltaic installations at different distances apart being determined; a change in the shading, in particular a change in a shape of the cloud drift, being established on the basis of the direction of the airflow and the variance.

In order to determine a large-area airflow, the movement directions and movement speeds of different shadings are, in accordance with the approach above, initially calculated as movement vectors. From several of these movement vectors it is then possible to calculate a large-area movement of the shadings (and hence the airflow), for example by forming a mean value. To this end, it is advantageous to observe the movement of one shading over a series of PV installations in the movement direction of the shading. Since the shape of a shading can change significantly during its movement over the PV installations, it is possible, for example, to use the variance of the movement directions and the movement speeds as a measure for the change in the cloud shapes and thus to take it into account when forecasting the future shadings.

A next embodiment includes determining the expected power output by the photovoltaic installation on the basis of the established change in the shading.

In order to estimate an absolute feed-in power, it is possible to make use of known models which, by means of meteorological information and the PV installation parameters, estimate the feed-in power, wherein the output thereof can be corrected by means of the newly obtained cloud-drift data.

Here, use is often made of analytical (physical) models, which are calibrated on the basis of the installation characteristics but not on the basis of the spatial situation or neighborhood. Taking account of external influences in this case remains restricted to a few local measurement values. Moreover, the type of interactions between external factors and the feed-in power is often restricted to linear relationships only.

One embodiment also includes the photovoltaic installation power being determined on the basis of a hybrid model, in particular on the basis of an error correction neural network.

Thus, using the error correction neural network (ECNN), it is possible to correct the deviation between the aforementioned model according to the prior art (e.g. an analytical model) and the actual feed-in power taking into account the cloud-drift information and optionally other (locally collected) data, e.g. the temperature.

The aforementioned object is also achieved by a device for setting a photovoltaic installation with a processing unit, which is configured such that a power output by the photovoltaic installation can be determined on the basis of at least one item of shading information from at least one adjacent photovoltaic installation.

In particular, in order to solve the problem, a PV installation is also proposed, which has a processing unit by means of which a power output by the photovoltaic installation can be determined on the basis of at least one item of shading information from at least one adjacent photovoltaic installation.

In particular, the processing unit can be a processor unit and/or an at least partly fixedly wired or logic switching arrangement, which, for example, is configured such that the method can be carried out as described herein. Said processing unit can be or comprise any type of processor or computational unit or computer with correspondingly required peripherals (memory, input/output interfaces, input/output devices, etc.).

The explanations above relating to the method correspondingly apply to the device. The device can be embodied in one component or distributed over several components. In particular, part of the device can also be connected by means of a network interface (e.g. the Internet).

One development includes the device being a photovoltaic installation.

The object is also achieved by a system comprising at least one of the devices or photovoltaic installations described herein.

BRIEF DESCRIPTION OF THE DRAWINGS

Exemplary embodiments of the invention will be depicted and explained below on the basis of the drawings.

DETAILED DESCRIPTION OF INVENTION

The proposed solution for forecasting the feed-in power of photovoltaic installations (PV installations) is distinguished, in particular, by virtue of the effects of the temporary shading of solar radiation by clouds and other weather effects being able to be taken into account.

To this end, information from the spatially adjacent PV installations is taken into account in a forecasting model. By way of example, this information can be employed on the basis of so-called measurement zones, wherein a measurement zone has several PV installations which spatially surround an installation to be observed at the present time.

Figure 1:
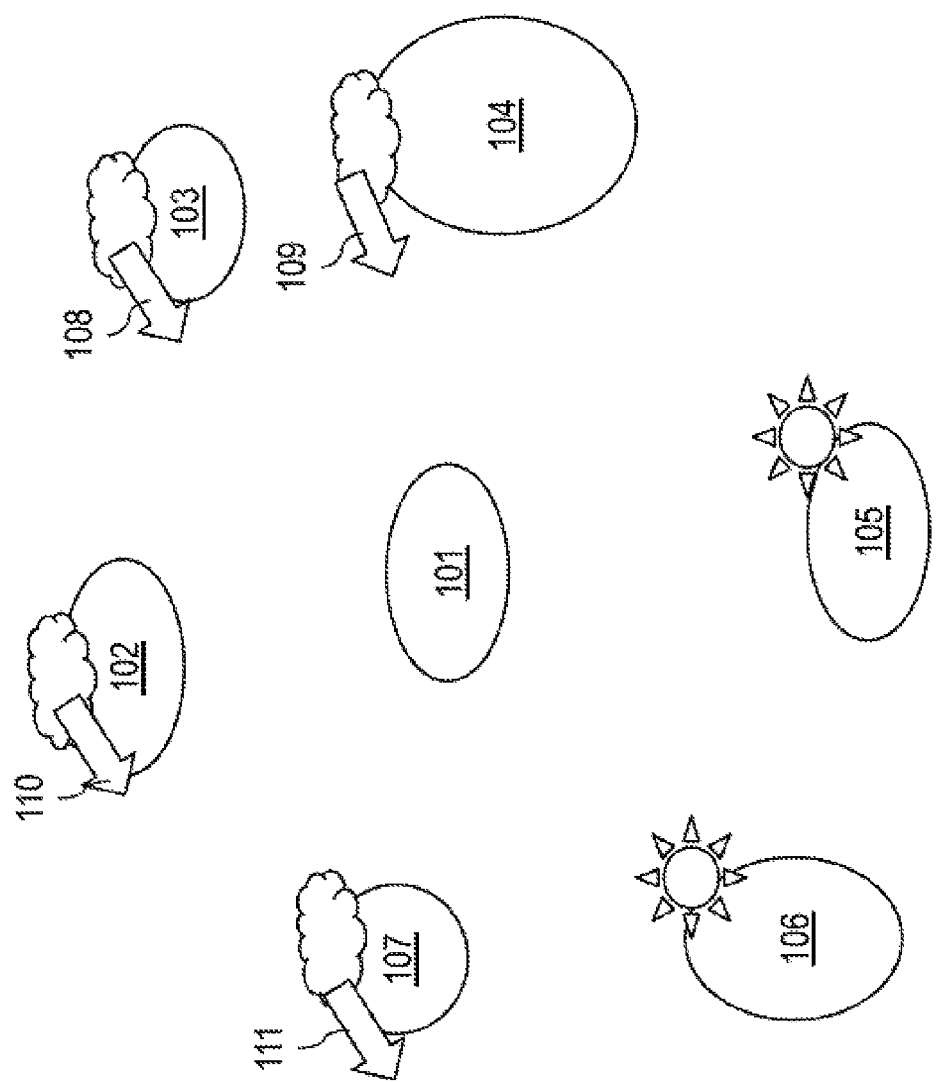
FIG. 1 shows a schematic diagram with one PV installation surrounded by several PV installations (also referred to as adjacent PV installations)

FIG. 1 shows a schematic diagram with one PV installation 101 and several adjacent PV installations 102 to 107. Each one of the PV installations 101 to 107 comprises a measurement zone, on the basis of which a shading can be determined. The measurement zone preferably relates to the solar modules: the shading can be deduced on the basis of the variation in the power output. Thus, an individual solar module or a group of solar modules can be used as a measurement zone. It is also possible for several (e.g. small) PV installations to be combined to form a single measurement zone; correspondingly it is possible for large PV installations to be employed as a single measurement zone or even to provide several measurement zones.

In FIG. 1, each PV installation 101 to 107 corresponds to a measurement zone in an exemplary manner, with the PV installations 102 to 107 being employed to predict a shading of the PV installation 101. By way of example, the sun is shining (without shading by clouds) over the PV installations 105 and 106. Correspondingly, no shading can be measured here. Clouds are in each case situated over the PV installations 102, 103, 104 and 107, and so there is a partial shading of the solar radiation. The shading can be determined on the basis of the respective measurement zone. It is also possible to establish a time profile of the shading. As a result of the time profile of the shading, it is possible to deduce a direction 109 to 111 of the movement of the clouds, as well as the speed thereof. This information can be provided by the adjacent PV installations 102 to 104 and 107 of the PV installation 101, which, on the basis of the distance from the adjacent PV installations 102 to 104 and 107, can predict when a shading is to be expected and possibly how strong this shading will turn out.

Here, the degree of cloudiness in the adjacent measurement zones of the PV installations 102 to 107 can be a first indication for a change in the feed-in power. In order to be able to determine a more accurate forecast, a direction of a cloud drift and a pattern of the cloud distribution, i.e. in particular a shape, length and width of a cloud and the change thereof, are taken into account.

In order to determine these factors, use is preferably not made of the airflow close to the ground (since this is only conditionally correlated to the direction of the cloud drift). It is also an option to distinguish between influences of low, medium-high and high clouds. Since the influence of medium-high and high clouds in the forecast is derived from the degree of cloudiness in the proposed solution from the meteorological data, the present approach also relates to the influence of those clouds which are responsible for the short-term shading effects and are possibly not (yet) taken into account in the meteorological data.

The solution proposed here determines the aforementioned parameters by a cross-correlation $R_{ab}$ of the various PV installations in the measurement zones. Here, the cross-correlation $R_{ab}$ of a feed-in power P of two PV installations a and b, which are arranged at a distance dab from one another, can be determined according to the relationship:

$$R_{ab} = \frac{1}{T} \cdot \int_{-T/2}^{T/2} P_a(t) \cdot P_b(t+\tau) \, dt,$$

with $$\tau = \frac{d_{ab}}{v_{Cloud}},$$

where T denotes a considered time interval and $v_{Cloud}$ is an (estimated) speed of the cloud drift.

Here, the speed of a cloud drift can be determined by maximizing the cross-correlations from various PV installation pairs in the same spatial alignment, while the direction of the cloud drift can be determined by the comparison of the cross-correlations of spatially differently aligned PV installation pairs.

When evaluating the cross-correlations of various PV installation pairs, the fact that the shape and movement of a cloud drift can be influenced by superposed effects is preferably taken into account. Such superposed effects can be established separately from one another. Firstly, a cloud drift moves within the scope of a large-scale weather flow, and so there should be a high cross-correlation even of PV installation pairs lying relatively far apart. However, the superposition of vertical airflows leads to a change in the shape and the optical density of a cloud drift, and so the cross-correlation can strongly reduce between PV installation pairs which are relatively far apart.

The solution presented here in particular makes use of this effect, for example by virtue of the direction of the large-scale airflow being determined first and the variance of the cross-correlation of PV installations at different distances apart from one another in the direction of the large-scale airflow being determined thereafter. As a result of these data it is then possible to estimate the change in the cloud drift in respect of the shape thereof.

The data in respect of the cloud drifts established thus are provided by the measurement zones of a forecast zone, wherein each zone, depending on the situation, can be both a measurement zone and a forecast zone.

Hence it is advantageous to design the zones in such a way that they correspond to the grid sections of a smart grid. In this case, occurrence of additional effects due to overlapping zones can be avoided.

The forecast zone advantageously employs the direction of the large-scale airflow established by the measurement zones and the inherent measurements, in order to identify those measurement zones which lie ahead of it in the flow direction and therefore are able to provide relevant data in respect of the forecast. Since determining the flow direction is afflicted by uncertainty, it may be advantageous to include the data from further measurement zones, weighted by the deviation from the estimated airflow direction.

The change in the feed-in power of the forecast zone can now be determined on the basis of the estimated movement of a cloud drift over the forecast zone, wherein, in a first approach, the change can be estimated from the current feed-in power and cloud shading relative to the future cloud shading.

In order to estimate an absolute feed-in power, it is possible to employ known models (e.g. analytical models), which estimate the feed-in power by means of meteorological information and the PV installation parameters, wherein the output thereof can be corrected by means of the newly obtained cloud-drift data.

By way of example, a hybrid model can be used for this, in which a so-called error correction neural network (ECNN) corrects the deviation between the aforementioned model according to the prior art and the actual feed-in power, taking into account the cloud-drift information and optionally other (locally collected) data, e.g. the temperature.

The solution proposed here therefore enables a short-term forecast of shading effects for PV installations and thus forms a basis for the balance between the fed-in and required amount of energy, since some operating means have to be actuated in advance (i.e. in good time) for cost-efficient balancing of the load flows. By way of example, a CHP installation has to be started in good time in order to be able to provide the energy lost should the PV installation be shaded.

A goal of such balancing includes avoiding the take up of an operating reserve from the superordinate grid section in order thus to save additional costs.

An option includes transmitting the data determined by the measurement zones to a central service, e.g. a meteorological service, in order to improve the forecast thereof by additional local information.

Figure 2:
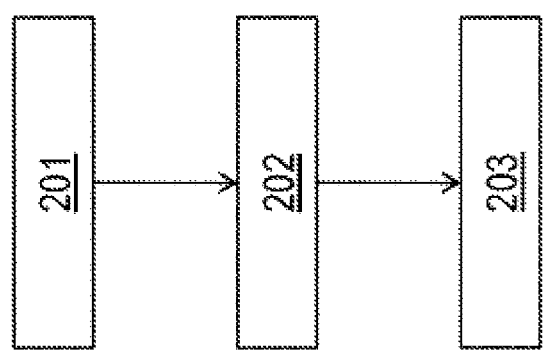
FIG. 2 shows a block diagram with steps of the method for determining or forecasting a power output by a PV installation.

FIG. 2 shows a block diagram with steps of the method for determining or forecasting a power output by a PV installation.

An item of shading information from at least one adjacent PV installation, e.g. by at least one measurement zone of the adjacent PV installation, is provided in a step 201. In a step 202, the shading information is used to establish a forecast for an imminent shading, e.g. in relation to a cloud drift, and, in a step 203, the predicted power output for the current PV installation is determined depending on this forecast. Hence, it is possible to decide whether (for example if a predetermined threshold value is reached) it is necessary to activate a substitute energy source in order to compensate for a power dip of the current PV installation.

The invention claimed is:

1. A method for determining a power output by a respective one photovoltaic installation of a plurality of photovoltaic installations, the method comprising:
providing to a processor unit associated with the respective one photovoltaic installation shading information by at least one adjacent photovoltaic installation being adjacent to the respective one photovoltaic installation,
establishing by the processor unit a temporal and spatial forecast in relation to an imminent shading on the basis of the shading information from the at least one adjacent photovoltaic installation,
determining by the processor unit the expected power output by the respective one photovoltaic installation on the basis of the imminent shading in relation to cloud drift,
wherein a speed of a shading, in particular of the cloud drift, is established by maximizing a cross-correlation $R_{ab}$ $$R_{ab} = \frac{1}{T} \cdot \int_{-T/2}^{T/2} P_a(t) \cdot P_b(t+\tau) dt,$$

with $$\tau = \frac{d_{ab}}{v_{Cloud}},$$

where
a, b denote two photovoltaic installations,
T denotes a considered time interval,
P denotes a feed-in power,
$d_{ab}$ denotes a distance between the photovoltaic installations a and b,
$v_{Cloud}$ denotes an estimated speed of the cloud drift, and activating a substitute energy source depending on the expected power output by the respective one photovoltaic installation.

2. The method according to claim 1, wherein the shading information comprises an item of information based on a reduced brightness and, in particular, based on a shading caused by cloud movement.

3. The method according to claim 1, wherein the substitute energy source comprises at least one of a controllable load, an energy store, and an energy producer.

4. The method according to claim 1, wherein the at least one adjacent photovoltaic installation comprises several adjacent photovoltaic installations arranged spatially surround the respective one photovoltaic installation at least in part.

5. The method according to claim 1, wherein, on the basis of the shading information, the temporal and spatial forecast in relation to the imminent shading is established using a forecasting model.

6. The method according to claim 1, wherein a direction of the shading, based on the cloud drift, is established on the basis of a comparison of the cross-correlations of spatially differently aligned photovoltaic installations.

7. The method as according to claim 1, further comprising:
determining a direction of an airflow,
determining a variance of the cross-correlation of photovoltaic installations at different distances apart, and
establishing a change in the shading, based on a change in a shape of the cloud drift, on the basis of the direction of the airflow and the variance.

8. The method according to claim 7, wherein the expected power output by the respective one photovoltaic installation is determined on the basis of the established change in the shading.

9. The method according to claim 8, wherein the power output is determined on the basis of a hybrid model wherein the hybrid model comprises an error correction neural network.

10. A device for setting a respective one photovoltaic installation, comprising:
a processing unit, configured to determine a power output by the respective one photovoltaic installation on the basis of shading information from at least one adjacent photovoltaic installation, wherein the processing unit to
receive the shading information provided by the at least one adjacent photovoltaic installation,
establish a temporal and spatial forecast in relation to an imminent shading on the basis of the shading information,
determine an expected power output by the respective one photovoltaic installation on the basis of the imminent shading in relation to cloud drift,
establish a speed of a shading, based on the cloud drift, by maximizing a cross-correlation $R_{ab}$ $$R_{ab} = \frac{1}{T} \cdot \int_{-T/2}^{T/2} P_a(t) \cdot P_b(t+\tau) dt,$$

with $$\tau = \frac{d_{ab}}{v_{Cloud}},$$

where
a, b denote two photovoltaic installations,
T denotes a considered time interval,
P denotes a feed-in power, $d_{ab}$ denotes a distance between the photovoltaic installations a and b, $v_{Cloud}$ denotes an estimated speed of the cloud drift, and activate a substitute energy source depending on the expected power output by the respective one photovoltaic installation.

11. The device according to claim 10, wherein the device is a photovoltaic installation.

12. The device according to claim 10 wherein a direction of the shading, based on the cloud drift, is established on the basis of a comparison of the cross-correlations of spatially differently aligned photovoltaic installations.

13. The device according to claim 10, wherein the processing unit to further:

determine a direction of an airflow, determine a variance of the cross-correlation of photovoltaic installations at different distances apart, and establish change in the shading, based on a change in a shape of the cloud drift, on the basis of the direction of the airflow and the variance.

14. The device according to claim 10, wherein the expected power output by the respective one photovoltaic installation is determined on the basis of the established change in the shading.

15. The device according to claim 10 wherein the power output is determined on the basis of a hybrid model wherein the bybrid model comprises an error correction neural network.

16. A system comprising at least one device, the at least one device for setting a respective one photovoltaic installation, comprising:

a processing unit, configured to determine a power output by the respective one photovoltaic installation on the basis of shading information from at least one adjacent photovoltaic installation, wherein the processing unit to receive the shading information provided by the at least one adjacent photovoltaic installation, establish a temporal and spatial forecast in relation to an imminent shading on the basis of the shading information, determine an expected power output by the respective one photovoltaic installation on the basis of the imminent shading in relation to cloud drift, establish a speed of shading, based on the cloud drift, by maximizing a cross-correlation $R_{ab}$ $$R_{ab} = \frac{1}{T} \cdot \int_{-T/2}^{T/2} P_a(t) \cdot P_b(t+\tau) dt,$$

with $$\tau = \frac{d_{ab}}{v_{Cloud}},$$

where a,b denote two photovoltaic installtions,

T denotes a considered time interval,

P denotes a feed-in power, $d_{ab}$ denotes a distance between the photovoltaic installations a and b, $v_{Cloud}$ denotes an estimated speed of the cloud drift, and activate a substitute energy source depending on the expected power output by the respective one photovoltaic installation.

\* \* \* \* \*